US007289865B2

(12) United States Patent
Bauer (10) Patent No.: US 7,289,865 B2
(45) Date of Patent: Oct. 30, 2007

(54) OPTIMIZATION ALGORITHM TO OPTIMIZE WITHIN SUBSTRATE UNIFORMITIES

(75) Inventor: Matthias Bauer, Riederich (DE)

(73) Assignee: ASM America, Inc., Phoenix, AZ (US)

( * ) Notice: Subject to any disclaimer, the term of this patent is extended or adjusted under 35 U.S.C. 154(b) by 489 days.

(21) Appl. No.: 10/892,013

(22) Filed: Jul. 14, 2004

(65) Prior Publication Data
US 2006/0031788 A1     Feb. 9, 2006

(51) Int. Cl.
*G06F 19/00* (2006.01)
(52) U.S. Cl. ........................ 700/121; 700/110
(58) Field of Classification Search ........... 700/109, 700/110, 121
See application file for complete search history.

(56) References Cited

U.S. PATENT DOCUMENTS

| | | | |
|---|---|---|---|
| 5,221,556 A | | 6/1993 | Hawkins et al. |
| 5,664,987 A | * | 9/1997 | Renteln ........................ 451/21 |
| 6,121,061 A | | 9/2000 | Van Bilsen et al. |
| 6,183,183 B1 | | 2/2001 | Goodwin et al. |
| 6,200,634 B1 | * | 3/2001 | Johnsgard et al. ........ 427/248.1 |
| 6,317,640 B1 | * | 11/2001 | Rao et al. ....................... 700/98 |
| 2002/0193899 A1 | * | 12/2002 | Shanmugasundram et al. ........................... 700/108 |
| 2003/0168442 A1 | * | 9/2003 | Porter et al. ................. 219/494 |
| 2003/0200047 A1 | * | 10/2003 | Martin et al. ................ 702/119 |
| 2007/0010033 A1 | | 1/2007 | Aderhold et al. |

OTHER PUBLICATIONS

Schaper et al., "Thermal Model Validation for Rapid Thermal Chemical Vapor Deposition of Polysilicon", J. Electrochem. Soc., vol. 143, No. 1, Jan. 1996 pp. 374-381.
Acharya et al., "Uniformity Optimization Techniques for Rapid Thermal Processing Systems," IEEE Transactions on Semiconductor Manufacturing, vol. 14, No. 3, Aug. 2001, pp. 218-226.

* cited by examiner

*Primary Examiner*—Ryan A Jarrett
(74) *Attorney, Agent, or Firm*—Knobbe, Martens, Olson & Bear LLP (57) ABSTRACT

A method to optimize semiconductor processing equipment (hardware settings and process conditions) to minimize non-uniformities within a wafer based on linescan measurements and a calculation of or prediction for a polar map. Measurements of a metrology value are taken at a number of points along a linescan (or two orthogonal linescans) on the wafer surface for a number of wafer processed in a set of experiments in which one equipment setting or process parameter is adjusted per experiment. The raw data are then normalized and weighted in accordance with the radial distance from the center of the wafer. Standard deviations of different metrology values within the wafer are then calculated. The setting can then be further adjusted to predict and to minimize the standard deviations, and therefore non-uniformity of the metrology values within the wafer, using the method without processing any additional test wafers.

42 Claims, 7 Drawing Sheets

| number of points in linescan | number of concentric measurement circles | number of points on polar map |
|---|---|---|
| 7 | 3 | 49 |
| 9 | 4 | 81 |
| 11 | 5 | 121 |
| 13 | 6 | 169 |
| 15 | 7 | 225 |
| 17 | 8 | 289 |
| 21 | 10 | 425 |
| 25 | 12 | 625 |
| 33 | 16 | 1089 |
| 49 | 24 | 2401 |

| number of points in linescan | number of concentric measurement circles | number of points on polar map |
|---|---|---|
| 7 | 3 | 49 |
| 9 | 4 | 81 |
| 11 | 5 | 121 |
| 13 | 6 | 169 |
| 15 | 7 | 225 |
| 17 | 8 | 289 |
| 21 | 10 | 425 |
| 25 | 12 | 625 |
| 33 | 16 | 1089 |
| 49 | 24 | 2401 |

FIG. 3

| Setting | MPI 1+5 | MPI 2+4 | MPI 3 | #2 | #9 | center | FSRd | FSRu | Tri-silane | $H_2$ | P |
|---|---|---|---|---|---|---|---|---|---|---|---|
| Baseline $S_{b\nu}$ | 2 | 3 | 1.75 | 30 | 55.5 | -1.3 | -3.25 | -3.25 | 250 | 100 | 16 |
| $\nu = 1$ | 2.25 | 3 | 1.75 | 30 | 55.5 | -1.3 | -3.25 | -3.25 | 250 | 100 | 16 |
| $\nu = 2$ | 2 | 3.25 | 1.75 | 30 | 55.5 | -1.3 | -3.25 | -3.25 | 250 | 100 | 16 |
| $\nu = 3$ | 2 | 3 | 3.25 | 30 | 55.5 | -1.3 | -3.25 | -3.25 | 250 | 100 | 16 |
| $\nu = 4$ | 2 | 3 | 1.75 | 38 | 55.5 | -1.3 | -3.25 | -3.25 | 250 | 100 | 16 |
| $\nu = 5$ | 2 | 3 | 1.75 | 30 | 45.5 | -1.3 | -3.25 | -3.25 | 250 | 100 | 16 |
| $\nu = 6$ | 2 | 3 | 1.75 | 30 | 55.5 | -6.3 | -3.25 | -3.25 | 250 | 100 | 16 |
| $\nu = 7$ | 2 | 3 | 1.75 | 30 | 55.5 | -1.3 | -8.25 | -3.25 | 250 | 100 | 16 |
| $\nu = 8$ | 2 | 3 | 1.75 | 30 | 55.5 | -1.3 | -3.25 | 1.75 | 250 | 100 | 16 |
| $\nu = 9$ | 2 | 3 | 1.75 | 30 | 55.5 | -1.3 | -3.25 | -3.25 | 200 | 100 | 16 |
| $\nu = 10$ | 2 | 3 | 1.75 | 30 | 55.5 | -1.3 | -3.25 | -3.25 | 250 | 90 | 16 |
| $\nu = 11$ | 2 | 3 | 1.75 | 30 | 55.5 | -1.3 | -3.25 | -3.25 | 250 | 100 | 24 |

OPTIMIZATION ALGORITHM TO OPTIMIZE WITHIN SUBSTRATE UNIFORMITIES

BACKGROUND OF THE INVENTION

1. Field of the Invention

The present invention relates to processing substrates in semiconductor fabrication, and more particularly to a method of adjusting semiconductor processing equipment to optimize uniformities within a wafer.

2. Description of the Related Art

Rapid thermal processing (RTP), including annealing, oxidation, and chemical vapor deposition (CVD), is a powerful technique for fabrication of integrated circuit devices. CVD is useful in the formation of semiconductor materials (e.g., single-crystalline, poly-crystalline and amorphous Si, SiGe, SiGe:C and Si:C alloys) in addition to dielectric oxides and nitrides as well as conductors, such as aluminum, copper, tungsten, titanium nitride, and numerous other metals and metal compounds. The move toward smaller devices and larger wafers has put more emphasis on the need for wafer uniformity during RTP. In processing wafers in a thermal reactor, it is therefore important to optimize wafer heating and other settings to maximize uniformity of the wafer in order to minimize variations in process results (e.g., thickness, resistivity, germanium content, carbon content).

A thermal reactor common in the art includes two banks of heating lamps arranged in orthogonal or crossed directions above and below a susceptor holding a semiconductor substrate. Each of the upper and lower surfaces of the substrate faces one of the two banks of heating lamps. A controller within the thermal reactor adjusts the relative power to each lamp to maintain a desired temperature during wafer processing. The controller receives signals indicative of wafer temperature from temperature sensors, such as pyrometers or thermocouples. The controller uses the temperature signals to make adjustments to the heating lamps to ensure uniformity in temperature across the wafer surface.

To place the reactor in an operating condition, the heating lamps require various adjustments prior to processing of the wafer. For example, one may need to adjust the position and the orientation of the heating lamps relative to a wafer in the semiconductor processing chamber. Similarly, each temperature sensor generally requires a controller offset adjustment (for a conventional proportional-integral-derivative or PID controller) to account for the variances in the sensitivity and accuracy of each sensor, in addition to its position relative to the wafer.

While efforts have been made to measure thickness to make these adjustments as described by Shaper et al. in *J. Electrochem Soc.*, 143, 374 (1996), such efforts are cumbersome, time-consuming, and complicated, requiring numerous expensive depositions, thickness measurements, optimization studies, and curve fitting. Currently, these adjustments to place the thermal reactor in operating condition are tedious and costly. For example, in a thermal reactor used for silicon epitaxy, crystal structure defects, such as slip planes, dislocations, and stacking faults, may result from temperature variations across the surface of the wafer. These defects and color variations (or other thickness measurements) are the only evidence available to a maintenance technician to identify and make wafer heating changes to eliminate non-uniformities. U.S. Pat. No. 6,126,744 describes a method of adjusting a reactor by forming a layer on a monitor wafer in the reactor and then observing the color variations from above the layer. The adjustments to the reactor are determined in accordance with the color variations, which correspond to thickness variations that result from surface temperature variations. However, such thickness or defect measurements provide only crude indications as to the location or the magnitude of adjustments to the temperature controllers that will address the non-uniformities.

Thus, equipment maintenance technicians employ a trial and error process to make the necessary adjustments to minimize wafer surface temperature differences. In another example, a slip plane defect in a silicon epitaxy layer appears as a line when viewed on an interference/contrast microscope using 50x magnification. The maintenance technician inspects the defective wafer to identify the slip plane defects and their locations to make adjustments. After completing the adjustments, the maintenance technician processes another production wafer to surmise the effectiveness of the adjustments. This second production wafer usually includes different slip plane defects as compared to those of the first production wafer, particularly where interplay among different temperature control zones make adjustments difficult to predict. The maintenance technician makes additional adjustments to compensate for the different slip plane defects and continues this iterative trial and error process until an acceptable density of defects results after processing a production wafer. The number of samples required often depends upon the experience and choices of the technicians. The inefficiency of this trial and error process results in loss of valuable production time as well as production wafers.

Maintenance technicians may also use an instrumented wafer to minimize temperature variation. An instrumented wafer is a wafer having a plurality of thermocouples mounted through its top surface. Each thermocouple provides to a data acquisition device signals indicative of the wafer temperature at the mounting location. Wafer processing conditions are simulated in the thermal reactor while the thermocouples provide temperature signals to the data acquisition device for analysis. Due to the connected cables/wires, this is only possible with a non-rotating wafer. A maintenance technician then analyzes the temperature profile data to determine adjustments needed to minimize surface temperature variations.

Unfortunately, the instrumented wafer thermocouples often fail after one or two hours of use under standard wafer processing conditions. Additionally, the thermocouples often provide false readings under the hydrogen flows of standard wafer processing conditions. The presence of metal wiring associated with the thermocouples creates an unacceptable risk of contamination to many semiconductor manufacturers. Some semiconductor manufacturers require a thermal reactor reconstruction or chamber clean after any use of an instrumented wafer. Moreover, the frequent failure of thermocouples and false readings decrease the reliability of the temperature data acquired through the thermocouples and consequently the effectiveness of any adjustments made in response to such data. It can be very costly for a semiconductor manufacturer to use multiple instrumented wafers and to reconfigure the thermal reactor. Efforts have been made to minimize temperature non-uniformity in non-rotating wafers, as described in Acharya et al., *IEEE Transactions on Semiconductor Manufacturing*, 14, 218 (2001).

Similar difficulties exist for optimizing numerous other parameters for semiconductor processing, such as gas flows and distribution, pressure, etc. It is therefore highly desirable to use a simple and robust uniformity optimization technique to attain the desired process uniformity without losing valuable production time and to minimize the number of monitor wafers used during system adjustment.

SUMMARY OF THE INVENTION

The present invention provides an efficient method to optimize semiconductor processing equipment to minimize process non-uniformities without the need to use the extensive trial and error methods that have been used in the past. Semiconductor manufacturers using the claimed invention can therefore save not only valuable time that can be used to process production wafers, but also wafers, chemicals, and money.

In the illustrated embodiments, a method is provided for optimizing uniformity within a wafer in which baseline measurements of wafer parameters are obtained from a wafer processed with baseline equipment settings. The settings of the equipment are then adjusted and subsequent wafers are processed with different equipment settings. Corresponding wafer parameters are measured for each of the subsequent wafers. The measurements of the first and subsequent wafers are normalized and a standard deviation of each parameter within the corresponding subsequent wafer is calculated by weighting the measurements in accordance with each measurement's corresponding radial distance from the center of the wafer and comparing against similarly weighted measurements of the same parameter in the baseline wafer. A wafer parameter profile is then generated by combining/mixing the normalized profiles by a linear superposition of the baseline profile and the corresponding profiles obtained for each subsequent change of one equipment setting. The above-described steps can be conducted once, or can be repeated for adjusted settings until a desired or minimal standard deviation is achieved. The method is well suited to predict or calculate optimized power settings (e.g., SCR ratios) for improved temperature uniformity during steady state (ssSCR ratios) as well as for ramps (rampSCR ratios). The method is particularly well suited to optimize gas-flow/distribution for mass-flow limited processes.

In accordance with one aspect of the invention, a method is provided for optimizing semiconductor manufacturing equipment to minimize non-uniformity of a wafer processed in a semiconductor processing chamber. A plurality of measurements of a wafer parameter of a first wafer processed in the chamber is obtained, and the measurements are weighted according to their radial distance from the center of the wafer. Then at least one setting of the chamber is adjusted. One test wafer is processed for each setting adjusted, and a plurality of measurements of the wafer parameter of the second wafer is obtained. Normalized measurements are calculated by normalizing the weighted measurements. A model is created relating the setting to a measure of non-uniformity of the wafer parameter by inputting the plurality of measurements, the weighted measurements, and the normalized measurements. The measure of non-uniformity is minimized to optimize the setting(s). In one embodiment, the measure of non-uniformity is the standard deviation of the wafer parameter within the wafer.

In accordance with another aspect of the invention, a method is provided for adjusting a semiconductor integrated circuit processing chamber for processing a substrate. Measurements of a parameter of a first substrate processed in the chamber are obtained at a plurality of points on the first substrate. At least one setting of the chamber is adjusted, and measurements of the parameter of a second substrate processed in the chamber are obtained at a plurality of points on the second substrate. A measure of non-uniformity of the wafer parameter is calculated by weighting and normalizing the measurements in accordance with a corresponding radial distance from a center of the first and second substrates.

In the illustrated embodiments, the equipment can be acceptably tuned using only one baseline wafer and one additional test wafer for each equipment setting to be optimized. Of course, additional iterations can be employed to improve uniformity even further, depending on the manufacturer's tolerances.

DETAILED DESCRIPTION OF THE PREFERRED EMBODIMENTS

The following detailed description of the preferred embodiments presents a description of certain specific embodiments to assist in understanding the claim. However, one may practice the present invention in a multitude of different embodiments as defined and covered by the claims.

For convenience, the description comprises three sections: Thermal Reactor, Uniformity Optimization Technique, and Summary. The first section provides an overview of a preferred embodiment of a thermal reactor for practicing the process, although it will be understood that the process is applicable to a wide variety of reactors. The following section describes the uniformity optimization technique of the preferred embodiment. The third section summarizes the advantageous features of the preferred embodiment.

Thermal Reactor

U.S. Pat. Nos. 5,221,556 and 6,183,183, which are incorporated herein, disclose exemplary chemical vapor deposition (CVD) reactors having reaction chambers. While the preferred embodiments of the claimed invention are described in connection with a "cold wall" CVD reactor for processing semiconductor wafers, it will be understood that the processing methods described herein will have utility in the context of reactors of other types. Skilled artisans will appreciate that the claimed invention is not limited to use within the particular reactor described herein. In particular, one of skill in the art can find application for the methods described herein for other semiconductor processing equipment, wherein a semiconductor substrate is to be treated under controlled conditions. The present invention can also be implemented in conjunction with other heating/cooling systems, such as those employing inductive or resistive heating. Moreover, precise temperature control is often required in the treatment of other substrates, including, without limitation, the deposition of optical thin films on glass or other substrates. In addition, while the methods described herein have particular utility for single wafer processing, the skilled artisan will readily find application for the advantages and principles described herein to other contexts.

Figure 1:
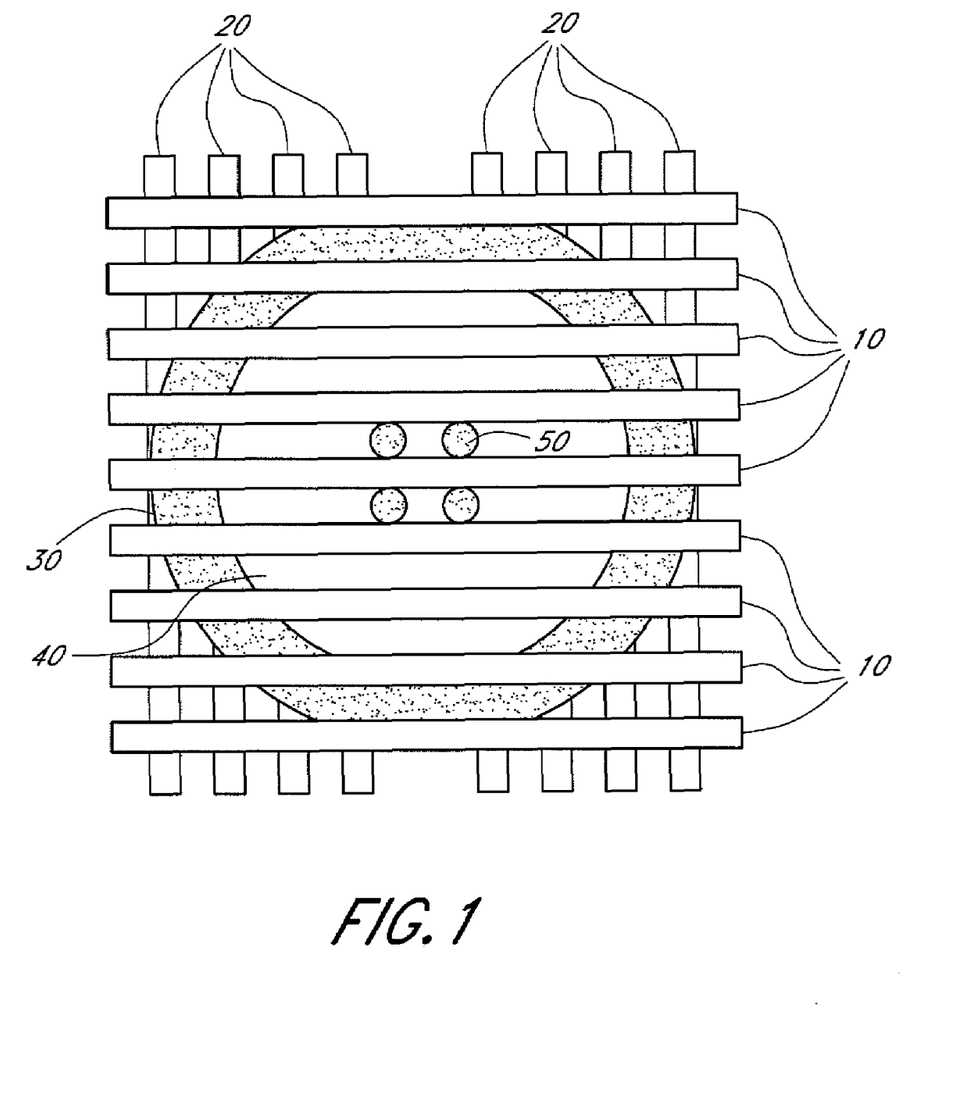
FIG. 1 is a plan view of the heating system that may be used in connection with the preferred embodiments of the present invention, which is shown from the top.

In the illustrated embodiment, a plurality of radiant heat sources are supported outside the chamber to provide heat energy to the chamber without appreciable absorption by the chamber walls. As shown in FIG. 1, the radiant heat sources described herein comprises nine linear lamps 10 above and eight linear lamps 20 below the susceptor 30 and wafer 40 arranged in a cross lamp pattern, where the upper heat lamps are arranged in an orthogonal direction to the lower heat lamps. There are also four spot lamps 50 below susceptor and wafer, as shown schematically in FIG. 1.

In this reactor, the wafer 40 rests on a circular SiC coated graphite susceptor 30 that serves as a rotating platform during wafer processing to improve process uniformity. A surrounding, non-rotating graphite ring houses four thermocouples used to measure temperature at the front, rear, left and right sides of the susceptor and provide input to a temperature controller, as is more fully described in U.S. Pat. No. 6,121,061, which is hereby incorporated by reference. A center thermocouple passes up through a rotation shaft to measure the temperature at the center of the susceptor. A quartz tube or chamber envelops the wafer 40 and the graphite susceptor 30 and ring, and separates the process environment from the lamps, which radiate through the quartz walls. For some processes, it may be advantageous to use reduced pressure process conditions. In order to reduce the pressure, the process chamber can be reinforced by quartz ribs or other strengthening mechanisms, which prevent the evacuated process chamber from imploding. In a preferred embodiment, the top, bottom, and side walls of the reactor surrounding the lamps and the quartz process chamber are preferably made of gold coated reflecting surfaces.

Uniformity Optimization Technique

The uniformity optimization technique of the present invention is based on creating a response surface that relates settings adjustments of the processing equipment to resultant wafer parameter measurements. A method is provided for optimizing uniformity within a wafer in which baseline measurements of a wafer parameter are obtained from a wafer processed with baseline equipment settings.

Figure 2A:
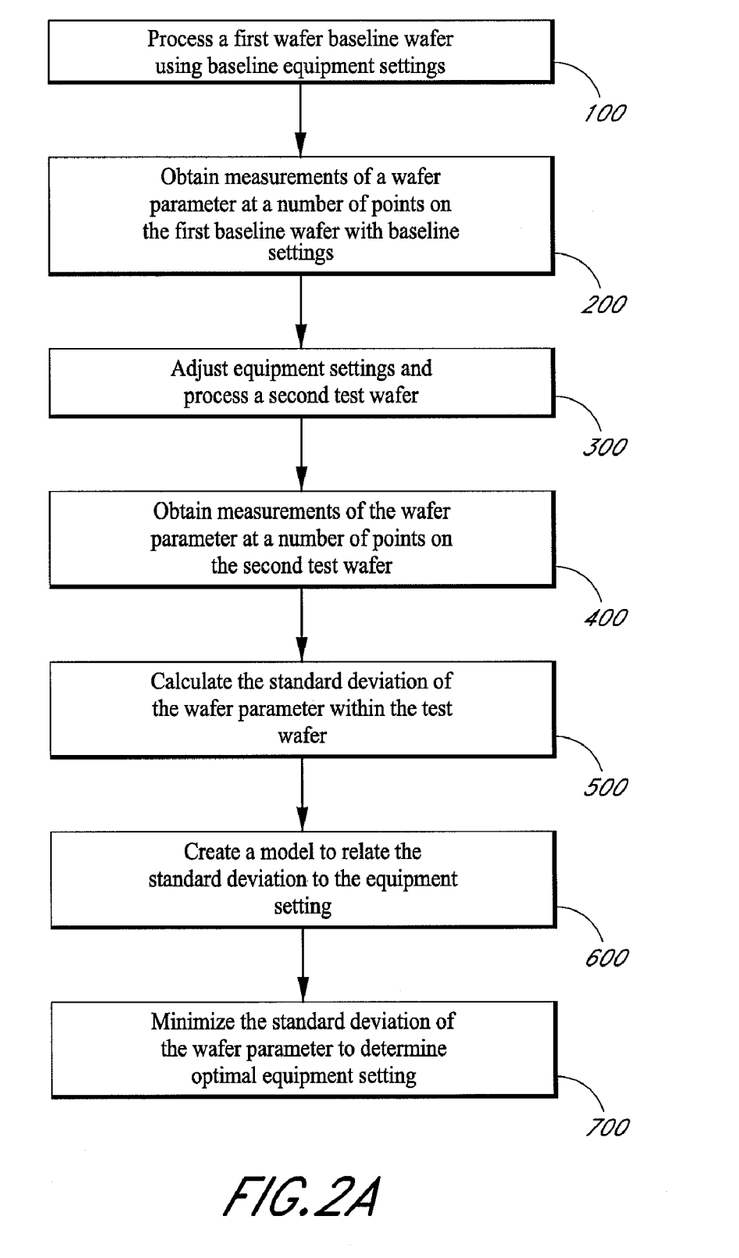
FIG. 2A is a process flow chart of the method of the preferred embodiments.

As shown in the process flow chart of FIG. 2A, baseline measurements of at least one metrology value (wafer parameter) are taken for a first or baseline wafer processed with baseline equipment settings in Steps 100 and 200. One of the settings of the equipment is then adjusted and a second test wafer is processed in Step 300. The wafer parameter is measured at a number of points for the second wafer in Step 400. A measure or indicator of non-uniformity, such as a standard deviation, of the wafer parameter within each wafer is calculated in Step 500. In Step 600, a predictive model is created to relate the measure of non-uniformity (particularly the standard deviation) to the change in the equipment setting in order to determine a more optimal setting to minimize non-uniformity of the wafer parameter. Creation of the model will be described in more detail below. In Step 700, the model is used to determine the equipment setting that will minimize measure of non-uniformity (particularly the standard deviation) of the wafer parameter.

Figure 2B:
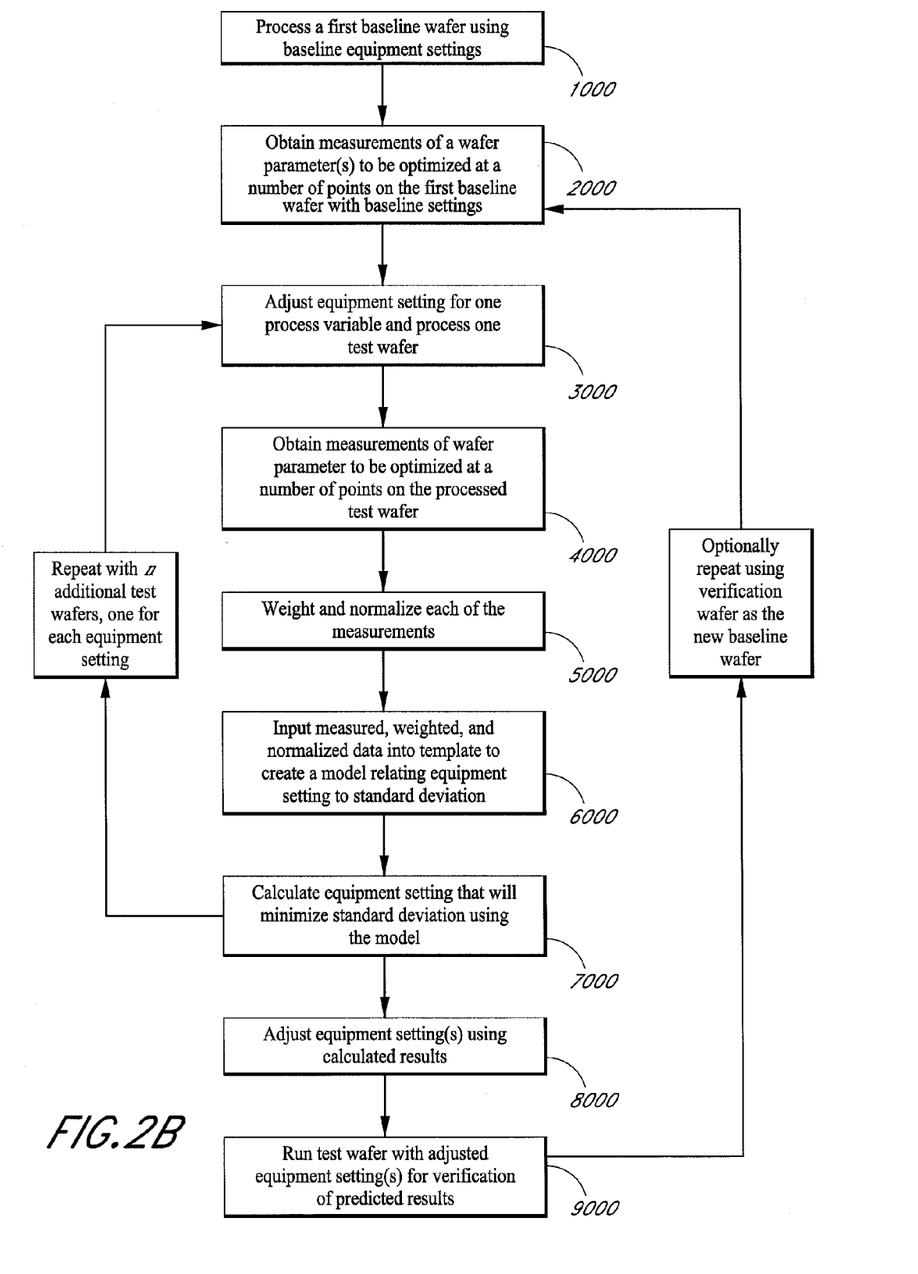
FIG. 2B is a more detailed process flow chart of the method of a preferred embodiment.

A more detailed description of a preferred embodiment will be described with reference to FIG. 2B. Baseline measurements of at least one metrology value (wafer parameter) are taken for a first or baseline wafer processed with baseline equipment settings in Steps 1000 and 2000. In the examples discussed herein, the wafer parameter corresponding to each of the settings is thickness of CVD layers deposited during processing. The skilled artisan will readily appreciate, however, that for other processes (e.g., dopant activation), a different parameter (e.g., resistivity of a layer deposited during processing or thickness of a layer that is etched with an $HCl/H_2$ mixture during processing) will correspond to certain of the settings to be optimized. In some cases, the settings will correspond to multiple parameters (e.g., CVD thickness, composition, and crystal defect densities can all be measured for optimization of various settings) in which case all of the parameters of interest are measured at a number of points on the baseline wafer.

In Step 3000, one of the settings of the equipment is then adjusted and a test wafer is processed and the wafer parameter is measured at a number of points for the processed test wafer in Step 4000.

The measurements of each of the baseline and test wafers are weighted and normalized relative to the mean value for each wafer of the corresponding polar map in Step 5000. Weighting and normalization will be described in more detail below. In Step 6000, the measured, weighted, and normalized data are inputted into a template (which will be described in more detail below) to create a predictive model that relates the equipment setting to the standard deviation (or other measure of non-uniformity) of the wafer parameter within the wafer. In Step 7000, the equipment setting that will minimize the standard deviation is calculated using the model created in Step 6000. Steps 3000-7000 can be repeated with n additional test wafers, one wafer for each different equipment setting to be adjusted, where n is the number of independently controllable settings to be optimized in the thermal reactor.

In Step 8000, the equipment settings are adjusted and optimized using the results calculated in Step 7000. In Step 9000, the predicted or calculated result (wafer parameter) can be experimentally verified by processing a wafer with the optimized settings and resultant process parameters. Optionally, steps 2000-9000 can be repeated, using the verification wafer from Step 9000 as a new baseline wafer. An embodiment of the invention will be described in more detail below.

The skilled artisan will appreciate that the method described above can be performed in a different sequence than the one described above. Examples of a different sequence will be given below with reference to FIG. 2A for simplicity in illustrating different possible sequences. Those skilled in the art that the same principles apply to the more detailed description of FIG. 2B. For example, the measurements of the wafer parameter of the baseline and test wafers may be obtained any time after the respective baseline or test wafers are processed. The skilled artisan will appreciate, however, that the measurements must be obtained prior to calculating the measure of non-uniformity of the wafer parameter.

In summary, a technician runs a set of experiments to measure a wafer parameter at a number of points, preferably obtained from a linescan. The set of experiments includes one experiment for each wafer processed for each equipment setting variable that can be optimized. A matrix is then generated, relating the measured parameters at points i to equipment settings v. Once the matrix has been generated, it can be used repeatedly to optimize process uniformity in an iterative fashion, which is preferably performed by computer calculation. In a thermal reactor having n independently controllable settings and m monitor locations (where process measurements are made) over the wafer surface, one generates the matrix by running a set of n+1 experiments. The first experiment is the baseline run and each subsequent experiment involves processing a test wafer with a single adjustment to a single setting, and a different setting for each experiment.

In the first experiment, the equipment settings are set to values that are estimated as a good starting point and a wafer is processed with these baseline settings. The measurements taken at the measurement points on the wafer for each subsequent experiment indicate the specific impact of a particular setting adjustment on the process results.

If the changes in settings variables are too small, then there is a possibility that the wafer response will be corrupted by noise. Large changes to settings variables will cause the measurement data to be inaccurate because it is based on a linearization of the system trajectory. It is therefore important to use the relatively small variations that are large enough to be well above the noise limit.

Apart from random noise, a systematic drift arising from a change in the state of secondary heat sources of the system (e.g., reflections off of the quartz chamber) can also disturb the measured values. Quartz has a long time constant compared to the wafer and graphite, and its peak temperature can increase over a span of several wafers during a processing run. Because the temperature of the quartz chamber increases non-uniformly over its surface, its spatial coupling to the wafer will depend on the number of wafers processed prior to the particular run. It is therefore important to eliminate these sources of drift by running several PCRCs (pre-cassette recipe cycles) prior to the deposition process.

The methods described herein may be used to minimize the non-uniformity within a wafer of a variety of parameters, including thickness, resistivity, sheet resistivity, germanium content, and carbon content. Advantageously, the methods are based on linescan measurements on rotated wafers, and are therefore more indicative of actual process conditions. The physical parameters of the film that can be measured and made uniform include, but are not limited to, thickness, sheet resistivity, resistivity, germanium content, carbon content, and refractive index. The equipment settings variables that can be altered in order to optimize the semiconductor processing equipment to minimize wafer non-uniformity include, but are not limited to, SCR ratios, temperature offsets, the flange gas injectors settings (by varying relative gas flow across the injector flange), precursor flows, and deposition pressure.

Figure 3:
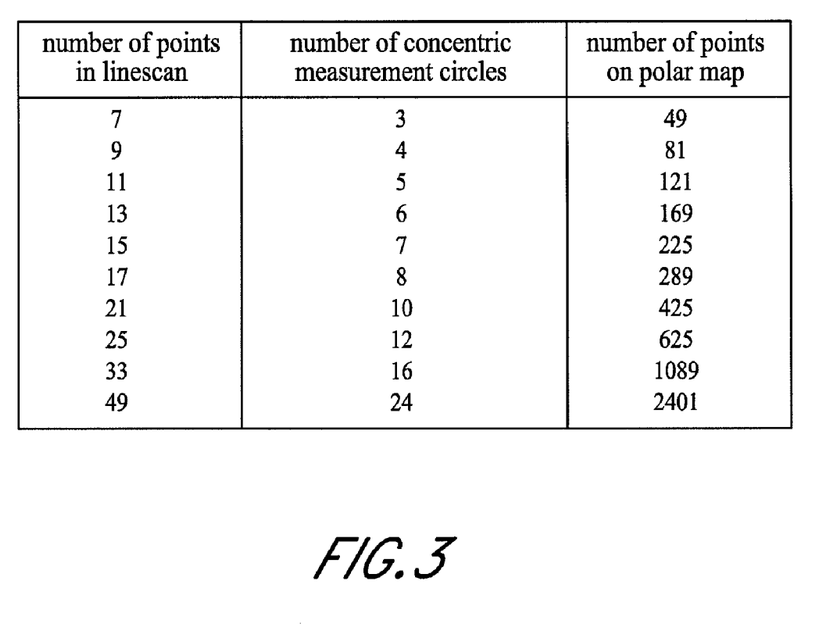
FIG. 3 is a table showing the number of points on a polar map and the corresponding number of concentric measurement circles and number of points in a linescan for such a polar map.

Although the optimization criteria may be chosen freely, a preferred embodiment uses the standard deviation of a calculated, predicted high-density polar map of a wafer parameter, such as thickness, resistivity or sheet resistivity, with equally spaced data points i, with the wafer having a defined edge exclusion zone of, for example, 4 mm. The polar map is preferably derived from a linescan. Optimization is done preferably with a 2401 point polar map rather than with a linescan itself. For example, from a 49 point linescan, a polar map can be calculated using a number of 24 equally spaced concentric measurement circles around the center point (i=0) of the wafer. Alternatively, polar maps can be calculated using, e.g., 16/12/10/8/6/5/4/3 equally spaced concentric measurement circles with a total of 1089/625/425/289/169/121/81/49 measurement points. The table of FIG. 3 provides the number of equally spaced concentric measurement circles, as well as the number of points in a linescan, for polar maps having different numbers of points.

A preferred embodiment of the invention will be described herein in connection with the calculation of a 2401 point polar map using 24 equally spaced concentric measurement circles about the center point of a notched silicon wafer having a diameter of 200 mm. In this embodiment, there are 49 points and the 2401 point polar map of a wafer is predicted from the 49 point linescan (m=49). The first innermost "circle" is one point at the center of the wafer. The second innermost concentric measurement circle has eight points. The third circle has 16 points. The third concentric circle has 24 points. Each subsequent concentric circle has eight more points than the circle immediately inward from it. The $24^{th}$, outermost circle has 192 points. In this embodiment, there are a total of 2401 points on the polar map.

Figure 4:
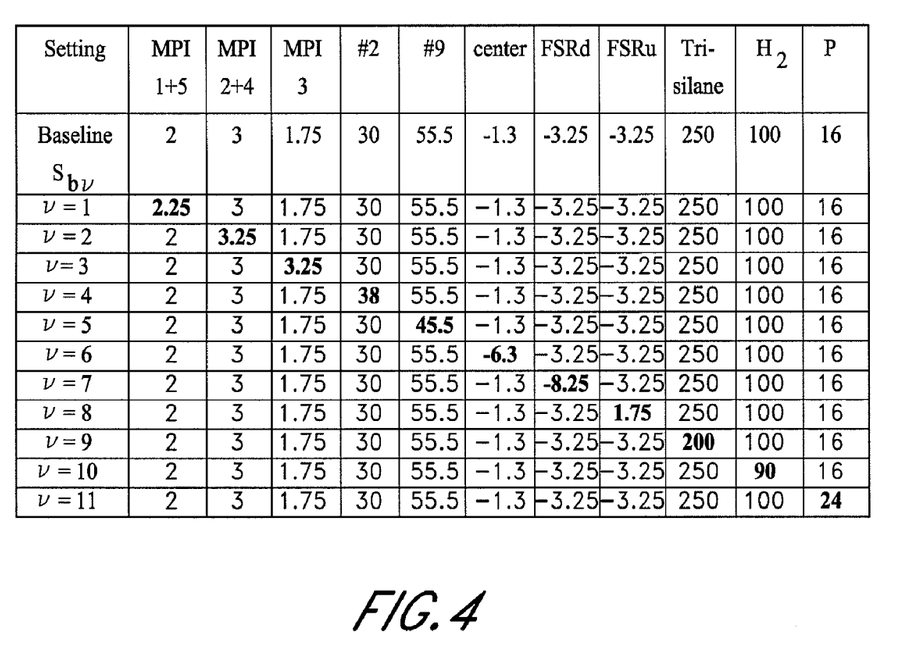
FIG. 4 is a table showing an example of settings of the semiconductor processing equipment for a baseline wafer and 15 subsequent test wafers, each for optimization of a different setting.

First, a first wafer is processed with the initial baseline settings of the processing equipment to obtain measured baseline metrology values (wafer parameters) for the wafer. The baseline settings for each settings variable, including adjustments for flange gas injectors, main hydrogen carrier flow, pressure, Si-precursor flow, Ge-precursor flow, dopant flow, temperature control offsets, SCR power ratios, and spot lamp direction, will be referred to as $S_{bv}$, where v=1, 2, 3, . . . , and each value 1, 2, 3, . . . represents a different settings variable. The table in FIG. 4 gives an example of the baseline settings. These values are shown in italicized font in the second row in FIG. 4, and are representative of settings values that were chosen as a good starting point for the process. A skilled artisan will appreciate that the values provided in the table in FIG. 4 are provided as an example of a particular process used in a particular semiconductor processing chamber, and that other baseline settings may be used for other processes and/or semiconductor processing equipment.

Once the wafer has been processed with the initial baseline settings, the baseline metrology values for a wafer parameter, such as metrology values for thickness, resistivity, sheet resistivity, germanium content, carbon content, degree of relaxation (R) of relaxed SiGe (rSiGe), strain ($\sigma$) of strained silicon (sSi), refractive index (n), etc., are obtained for a number of points i on a linescan.

The preferred embodiments of the present invention will be described with respect to minimizing non-uniformity of a metrology value $\zeta$. Those skilled in the art will appreciate that the metrology value may represent any one of many different wafer parameters, including thickness, resistivity, sheet resistivity, germanium content, carbon content, R, $\sigma$, and n, and that non-uniformity within a wafer of such parameters may be minimized using the methods described herein.

In this embodiment of the invention, $\zeta_i$ represents the metrology value at the ith measurement point for a wafer processed, where i is the measurement data point. As described herein, v represents the equipment settings variable to be optimized and v=1 to n. The number of measurement points m should be greater than or equal to the number of different variables v in the system. In the embodiment described herein in connection with the table in FIG. 4, there are 11 settings variables (v=11) to be optimized and in a preferred embodiment, a technician will run 12 separate experiments processing 12 different test wafers, including one baseline test wafer and 11 subsequent test wafers.

Once the baseline metrology value $\zeta_i$ for each point i has been measured, the next step is to calculate the mean baseline metrology value $\mu_\zeta$ of each pair of points centered about the center point (i=0) of the wafer. The mean metrology value $\mu_\zeta$ of two points, i and −i, centered about the center point of the wafer is given by the following equation:

$$\mu_\zeta = \frac{\zeta_i + \zeta_{-i}}{2} \quad (1a)$$

Alternatively, using two linescans perpendicular to each other, the mean metrology value of four points i, −i, i, and −i centered about the center point of the wafer can be used. The mean metrology value $\mu_\zeta$ of four points, i, −i, i, and −i, centered about the center point of the wafer is given by the following equation:

$$\mu_\zeta = \frac{\zeta_i + \zeta_{-i} + \zeta_i + \zeta_{-i}}{4}. \quad (1b)$$

The spacing $\delta$ between two neighboring measurement locations of the m measurement points is calculated by $$\delta = \frac{D - 2EE}{(m-1)} = \frac{192}{48} = 4 \quad (1c)$$

where D represents the wafer diameter (e.g., 200 mm), and EE represents the edge exclusion (e.g., 4 mm). For example, for two points ($\zeta_4$, $\zeta_{-4}$) that are each located at a radial distance $\delta$ (e.g., 4 mm) from the center point of the wafer, the mean metrology value $\mu_\zeta$ of the wafer between the two points ($\zeta_4$, $\zeta_{-4}$) is given by the average of the metrology values measured at the two points ($\zeta_4$, $\zeta_{-4}$). Alternatively, for four points ($\zeta_4$, $\zeta_{-4}$, $\zeta_4$, $\zeta_{-4}$), from perpendicular linescans, that are each located at a radial distance $\delta$ (e.g., 4 mm) from the center point of the wafer, the mean metrology value $\mu_\zeta$ of the wafer between the four points ($\zeta_4$, $\zeta_{-4}$, $\zeta_4$, $\zeta_{-4}$) is given by the average of the metrology values measured at the four points ($\zeta_4$, $\zeta_{-4}$, $\zeta_4$, $\zeta_{-4}$). For two points ($\zeta_8$, $\zeta_{-8}$) that are each positioned at a radial distance of 2$\delta$ (e.g., 8 mm) from the center point of the wafer, the mean metrology value $\mu_\zeta$ between those two points ($\zeta_8$, $\zeta_{-8}$) is given by the average of the metrology values measured at those two points ($\zeta_8$, $\zeta_{-8}$). Alternatively, for four points ($\zeta_8$, $\zeta_{-8}$, $\zeta_8$, $\zeta_{-8}$), from perpendicular linescans, that are each positioned at a radial distance of 2$\delta$ (e.g., 8 mm) from the center point of the wafer, the mean metrology value $\mu_\zeta$ between those four points ($\zeta_8$, $\zeta_{-8}$, $\zeta_8$, $\zeta_{-8}$) is given by the average of the metrology values measured at those four points ($\zeta_8$, $\zeta_{-8}$, $\zeta_8$, $\zeta_{-8}$). Although the radial distance $\delta$ is 4 mm in the examples described herein, the skilled artisan will appreciate that the radial distance $\delta$ can be any distance from the center point of the wafer.

The weighted mean metrology value of the wafer $\mu_{\zeta weighted}$ is then calculated by weighting the metrology data in accordance with their radial distance from the center point of the wafer. In this embodiment, the data points from the radially outer portions of the wafer are weighted more than those closer to the center of the wafer. In this embodiment, the weighted mean metrology value of the wafer $\mu_{\zeta weighted}$ is given by the following equation:

$$\mu_{\zeta weighted} = \frac{(\mu_0 + \mu_8 * 8 + \mu_{16} * 16 + \mu_{24} * 24 + \mu_{32} * 32 + \ldots + \mu_{96} * 96)}{K} \quad (2)$$

$$\text{with } K = 1 + \sum_{j=0}^{(m-1)/2} j * 8,$$

and where m represents the number of monitor locations on the linescan, K represents the total number of points in the polar map (which can be calculated from a linescan with m monitor locations), and $\mu_0$ is the metrology value measured at the center point of the wafer, $\mu_\delta$ is the mean metrology value of points each $\delta$ (e.g., 4 mm) from the center point of the wafer, and $\mu_{2\delta}$ is the mean metrology value of points each 2$\delta$ (e.g., 8 mm) from the center point of the wafer, $\mu_{3\delta}$ is the mean metrology value of points each 3$\delta$ (e.g., 12 mm) from the center point of the wafer, $\mu_{4\delta}$ is the mean metrology value of points each 4$\delta$ (e.g., 16 mm) from the center point of the wafer, and so forth. In this embodiment, the polar map has 2401 total points and K=2401.

Next, a normalized metrology value $N_{\zeta i}$ is preferably calculated for each point i for each corresponding $\mu_\zeta$ value with the weighted mean metrology value $\mu_{\zeta weighted}$, by calculating the ratio of each mean metrology value $\mu_\zeta$ to the weighted mean metrology value $\mu_{\zeta weighted}$. The normalized value $N_{\zeta i}$ for each point i is therefore given by the following equation:

$$N_{\zeta i} = \frac{\mu_{\zeta i}}{\mu_{\zeta weighted}} \quad (3)$$

Each of the settings variables v is then adjusted to a different setting $S_{av}$ for one of the subsequent test wafers. In the table shown in FIG. 4, the adjusted $S_{av}$ values are shown in boldface. In the illustrated embodiment, the settings variables v include the settings for flange gas injectors (in FIG. 4, MPI 1+5 refer to the two outside injectors, MPI 2+4 refer to the two inside injectors, and MPI 3 refers to the center injector), main hydrogen carrier flow ($H_2$ in slm in FIG. 4), pressure (P in torr in FIG. 4), Si-precursor flow (trisilane, silane, dichlorosilane or DCS, trichlorosilane or TCS) (Trisilane in sccm in FIG. 4), Ge-precursor flow (germanium, digermane, tetrachlorgermane) and dopant flow (diborane, arsine, phosphine, etc.) and dopant flow distribution, PID temperature offsets (center, front, side, rear) (center, FSRd, and FSRu in FIG. 4), and SCR power ratios (#2 and #9 in FIG. 4), (where each variable is represented by v=1, 2, 3, . . . ). One may freely choose to optimize any number of equipment settings n for which n+1 experiments are run in order to generate the data for optimizing the settings.

Those skilled in the art may recognize that for mass flow limited type of processes, like high temperature epitaxy with DCS/TCS at 1000-1200° C. or deposition with trisilane at 550-800° C., gas flow distribution (e.g., "MPI" or injector settings), main hydrogen carrier flow, pressure, Si precursor flow and rotation speed are the most important factors to optimize. For reaction rate limited processes, like low temperature SiGe epitaxy between 500 and 750° C. with $SiH_4$ and DCS, temperature uniformity is very important. Therefore temperature control offsets and SCR ratios are key factors to optimize. For doped layers, total dopant flow and dopant flow distribution are preferably also considered/included for optimization.

Those skilled in the art will appreciate that to avoid crystalline slip and/or to achieve uniform oxygen removal during certain rapid thermal cleaning (hydrogen bake) processes, a different set of SCR ratios for steep ramps may be employed to maintain temperature uniformity during ramp and to achieve identical peak temperature to have the same effect on thermal budget.

The accumulated thickness of grown or deposited polysilicon on oxide wafers during heat/ramp up (and cool down) can be used as a process monitor for peak/ramp temperature uniformity. An alternative process monitor for peak/ramp temperature uniformity is the measurement of sheet resistivity of annealed implanted wafers using the temperature dependent activation of originally electrical inactive implanted dopant species (e.g., As or B). A change in sheet resistivity caused by the diffusion of a shallow/narrow dopant profile can also be used as a temperature monitor. Alternatively, a change in an amorphous silicon ($\alpha$-Si) film thickness of an incomplete Solid Phase Epitaxial (SPE) regrowth from a homogenous $\alpha$-Si can be used as a temperature monitor.

For each experiment (test wafer) subsequent to the initial baseline wafer, only one settings variable is adjusted $S_{av}$, and the remaining variables are the same as those in the initial baseline experiment, as shown in the table in FIG. 4. A new wafer is processed with each settings variable changed and values of the wafer metrology are measured at each point i for each wafer processed for each settings variable adjusted. As shown in the table in FIG. 4, only one setting is adjusted per wafer per process run ($S_{av}$ values are shown in boldface). The values given by Equations 1, 2, and 3 above are calculated for each settings variable adjusted. One additional calculation is preferably conducted for each settings variable changed, comparing the normalized baseline parameter values of each point i with the corresponding normalized measured parameter values of each point i for each subsequent test wafer. This additional calculation is given by the following equation:

$$N_{b/v} = N_{\zeta v} - N_{\zeta} \quad (4)$$

where $N_{\zeta v}$ is the normalized value for each point i for each corresponding $\mu_{\zeta v}$ value with the weighted mean metrology value $\mu_{\zeta weighted}$ for a wafer processed with a settings variable v adjusted, and $N_{\zeta}$ is the normalized metrology value that is obtained from processing the first wafer with the initial baseline settings.

One may now use the above equations to predict the standard deviations of the metrology value $\zeta$ within a wafer based on further tuning of the settings variables. For example, a user of this method may calculate the result of a theoretical further adjustment of the setting S of variable v to a different setting $S_{pv}$. Once the equations described above have been calculated for each point i, the next step is to calculate a factor $F_v$ for each variable v. The calculation for the factor $F_v$ is given by the following equation:

$$F_v = \frac{S_{pv} - S_{bv}}{S_{av} - S_{bv}} \quad (5)$$

where $S_{bv}$ is the baseline setting, $S_{av}$ is the adjusted setting, and $S_{pv}$ is the further adjusted setting.

The calculation of factor $F_v$ is then repeated for each settings variable v changed. For each wafer processed, only one variable is adjusted as noted above. Therefore, if a user would like to adjust three different variables (n=3) (e.g., three different flange gas injector settings), the user processes four wafers, one test wafer for each variable adjusted plus one baseline wafer to obtain the initial baseline metrology values. In the example shown in FIG. 4, there are 11 different settings variables (n=11), so in accordance with this embodiment of the invention, a technician runs 12 experiments, processing a different wafer each time for a total of 12 different wafers.

Once the factor $F_v$ for each variable v has been calculated, the next step is to calculate the adjusted normalized value X for each point i for the adjusted variables by multiplying each normalized value with the corresponding factor $F_v$ value, using the following equation:

$$X_i = N_{\zeta i} + \sum_{v=1}^{n} N_{\zeta iv} * F_v \quad (6)$$

where v=1, 2, 3, ..., and 1, 2, 3 ... each represent a different settings variable v that is adjusted.

A goal of the above process is to minimize non-uniformity of a wafer parameter by predicting and minimizing the standard deviation of the metrology value within the wafer. Once the normalized value X has been calculated, the standard deviation $\sigma$ of the metrology value $\zeta$ within the wafer may be calculated, using the template of the following equation:

$$\sigma = \sqrt{\frac{(X_0 - 1)^2 + (X_\delta - 1)^2 * 8 + (X_{2\delta} - 1)^2 * 16 + (X_{3\delta} - 1)^2 * 24 + K + (X_{\delta(m-1)/2} - 1)^2 * 8 * (m-1)/2}{1 + \sum_{j=0}^{(m-1)/2} j * 8}} \quad (7)$$

Equation (7) represents a template that relates the setting S to a measure of non-uniformity, particularly the standard deviation $\sigma$ of the metrology value $\zeta$. When the normalized values X are entered into Equation (7), it becomes a predictive model relating the setting S to the standard deviation $\sigma$. The skilled artisan will recognize that for each variable v, there will be a different model. Those of skill in the art will understand that one will need to continue to calculate the optimal equipment settings, using an iterative process (which can be done either manually or by a computer) until the desired standard deviation is achieved using the algorithm described above. The skilled artisan will appreciate that, for example, the standard deviation, or other measure of non-uniformity, may be minimized by numerically iterating $S_{pv}$ until the standard deviation $\sigma$ equals zero, or the desired minimal value.

There is no need to process any additional test wafers to optimize the tuning of the semiconductor processing equipment. Only n+1 test wafers need to be processed in order to use the algorithm described herein to optimize the equipment for n settings. There is therefore no need to employ a trial and error process. A skilled artisan will appreciate that automated tools, such as a computer software program, may be used with the method described herein to automatically calculate the standard deviation of the wafer parameter for a given setting to optimize values for the settings of the semiconductor processing equipment. The settings may be calculated on a computer using the above-described algorithm to optimize the semiconductor processing equipment to minimize wafer non-uniformity without processing too many test wafers. More than one target function or cost function can be optimized at the same time (e.g., thickness and resistivity, or thickness and germanium content or thickness, resistivity and germanium content).

The equipment can then be adjusted to process wafers with the predicted settings. Preferably, at least one wafer is processed with the predicted settings to confirm the results. This wafer can also be used as a new baseline wafer (with improved baseline settings calculated by the above process) to further optimize the equipment by repeating the process described above with new subsequent test wafers.

Figure 5:
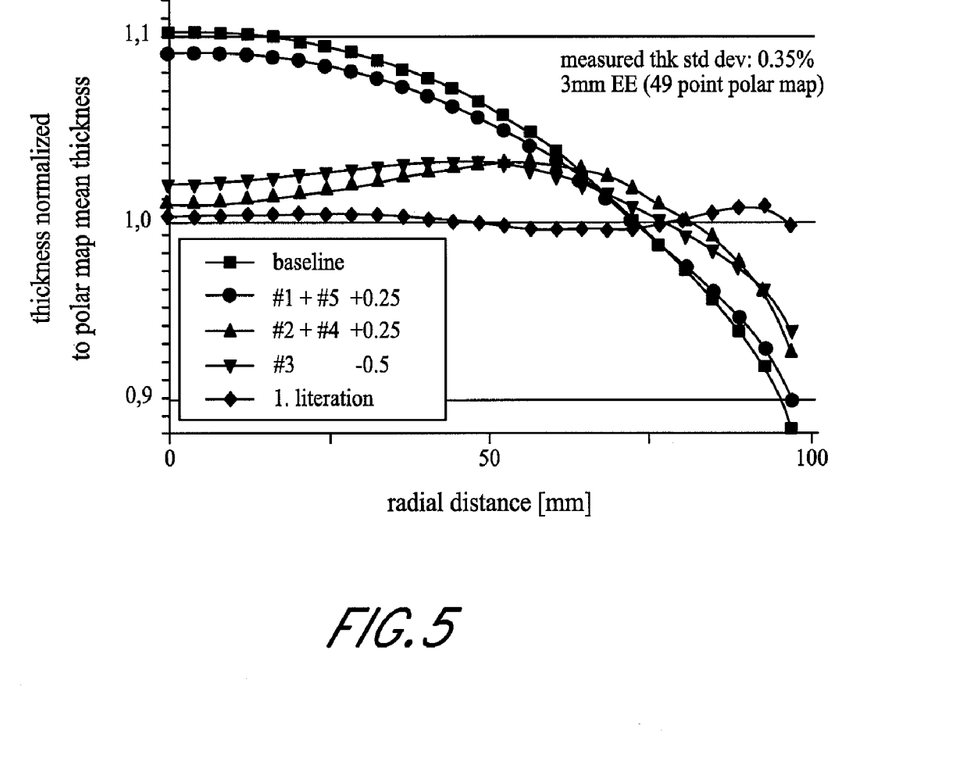
FIG. 5 is a graph of wafer thickness across the diameter of a 200 mm wafer for five wafers processed with the baseline settings, three different adjusted gas flow injector settings, and the optimized settings predicted with the preferred process.
Figure 6:
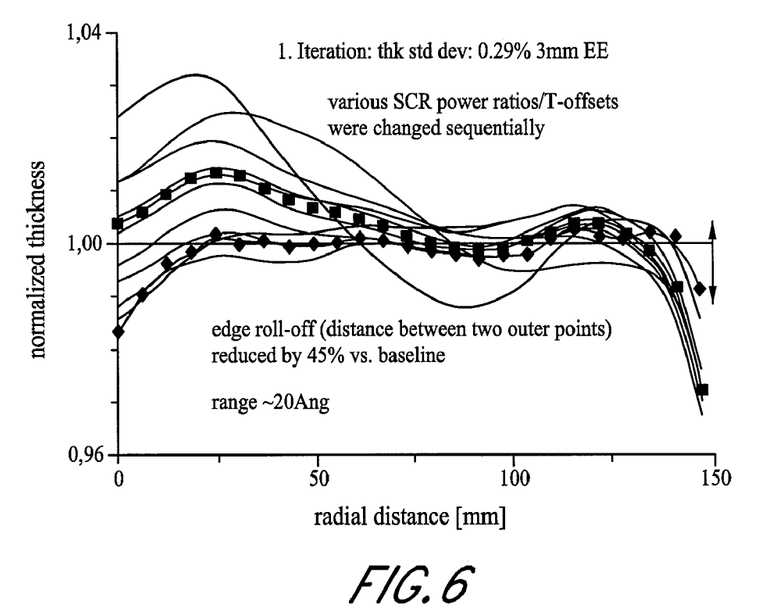
FIG. 6 is a graph of wafer thickness across the diameter of a 300 mm wafer for wafers processed with the baseline settings, multiple different adjusted SCR power ratio and temperature offset settings, and the optimized settings predicted with the preferred process.
Figure 7:
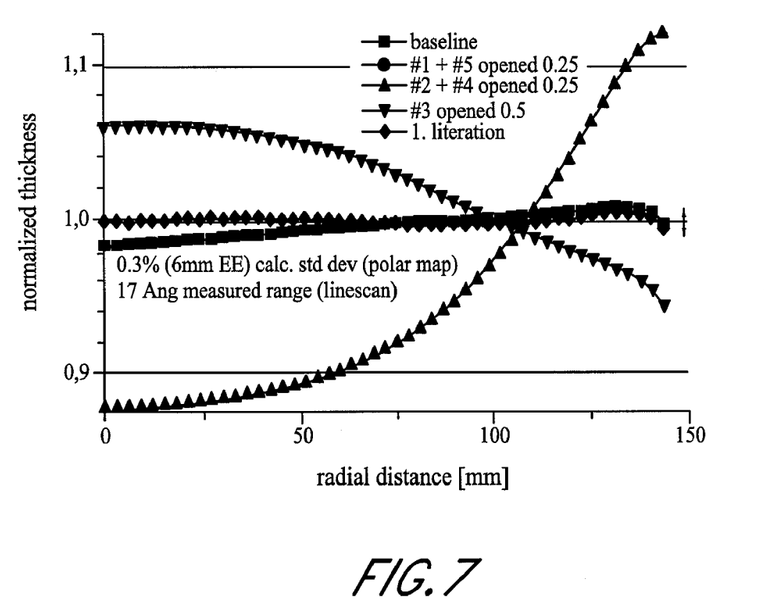
FIG. 7 is a graph of wafer thickness across the diameter of a 300 mm wafer for wafers processed with the baseline settings, three different adjusted gas flow injector settings, and the optimized settings predicted with the preferred process.

FIGS. 5-7 show three examples of graphs of wafer thickness using settings predicted by the method described herein. FIG. 5 shows a graph of wafer thickness across the diameter of a 200 mm wafer for wafers processed with the baseline settings, three different adjusted settings (#1+#5 are the outside flange gas injectors, #2+#4 are the inside two flange gas injectors, and #3 is the center flange gas injector), and the optimized settings predicted with the method described above. In the graph of FIG. 5, the measured standard deviation of the thickness is 0.35% on a 49 point polar map, using the predicted settings, labeled "1. Iteration" and representing measurements on a verification wafer after processing one baseline wafer, one additional test wafer per setting, and one verification wafer. As shown in the graph of FIG. 5, the uniformity of the wafer thickness is improved by using the methods described herein, with even one iteration or loop of FIG. 2B, to adjust the equipment settings to minimize non-uniformities within the wafer.

FIG. 6 shows a graph of radial thickness profiles from 300 mm wafers (averaged of four half radial scans) processed with the baseline settings, 20 different adjusted settings of various SCR power ratios and temperature offsets, and the optimized settings (labeled "1. Iteration") predicted with the method described above. In the graph of FIG. 6, the calculated standard deviation of the thickness profile and the calculated thickness uniformity is 0.29% (3 mm EE) for a 2401 point polar map. As shown in the graph of FIG. 6, the uniformity of the wafer thickness is greatly improved by using the methods described herein to adjust the equipment settings to minimize non-uniformities within the wafer.

FIG. 7 shows a graph of wafer thickness across the diameter of a 300 mm wafer for wafers processed with the baseline settings, three different adjusted settings of the gas injectors settings shown in FIG. 5, and the measured profile with the settings optimized with the method described above. In the graph of FIG. 7, the calculated standard deviation of the thickness is 0.3% (6 mm EE) based on a 99 point linescan. As shown in the graph of FIG. 7, the uniformity of the wafer thickness is improved by using the methods described herein to adjust the equipment settings to minimize non-uniformities within the wafer.

SUMMARY

The preferred embodiments advantageously overcome several limitations of existing technologies. The methods are much more efficient than conventional trial and error methods to optimize the tuning of semiconductor processing equipment. Such trial and error methods resulted in substantial down time of the processing equipment in addition to requiring the need for processing many test wafers. By using the optimization techniques described herein, semiconductor manufacturers can save not only time and money, but also wafers. The substantial down time from traditional trial and error processes can be recovered and production wafers can be processed instead of test wafers. The methods described herein also minimize the risk of inaccurate measurements in a trial and error process, as much of the optimization is done by calculations comparing measurements on only a pair of wafers per setting, and one of those two wafers is repeatedly used as the baseline for each additional setting to be optimized.

Those skilled in the art may practice the principles of the present invention in other specific forms without departing from its spirit or essential characteristics. Accordingly, the disclosed embodiments of the invention are merely illustrative and do not serve to limit the scope of the invention set forth in the following claims.

What is claimed is:
1. A method of optimizing semiconductor manufacturing equipment to minimize non-uniformity of a wafer processed in a semiconductor processing chamber, comprising:
   obtaining a plurality of measurements of a wafer parameter of a first wafer processed in the chamber comprising taking data from a linescan;
   weighting the plurality of measurements of the first wafer according to a radial distance from a center of the first wafer;
   adjusting at least one setting of the chamber;
   processing one test wafer for each setting adjusted;
   obtaining a plurality of measurements of the wafer parameter of each test wafer processed in the chamber for each setting adjusted, wherein the plurality of measurements comprise data from a linescan;
   creating a model relating each setting adjusted to a measure of non-uniformity of the wafer parameter using the plurality of measurements and weighted measurements;
   using the model to minimize the measure of non-uniformity to determine an optimal setting for the at least one setting; and
   adjusting the at least one setting of the chamber to the optimal setting.

2. The method of claim 1, further comprising:
   weighting the plurality of measurements of each test wafer according to a radial distance from a center of each test wafer; and
   calculating normalized weighted measurements by normalizing the weighted measurements before creating the model and inputting the normalized weighted measurements into a template created with the plurality of measurements and the weighted measurements.

3. The method of claim 1, wherein the measure of non-uniformity of the wafer parameter is a standard deviation of the wafer parameter.

4. The method of claim 1, wherein the method is performed using data from only the first wafer and one test wafer for each setting.

5. The method of claim 1, wherein the plurality of measurements of the first wafer are weighted by weighting radially outer portions of the first wafer more than the center of the first wafer.

6. The method of claim 1, further comprising weighting the plurality of measurements of the test wafer according to a radial distance from a center of the test wafer, wherein weighting occurs before creating the model.

7. The method of claim 2, further comprising comparing the normalized weighted measurements of the first wafer with the normalized weighted measurements of the test wafer.

8. The method of claim 1, wherein obtaining a plurality of measurements comprises calculating a polar map of the wafer parameter from the linescan data.

9. The method of claim 8, wherein the measure of non-uniformity is a standard deviation of the polar map of the wafer parameter.

10. The method of claim 1, wherein the parameter is thickness of a layer deposited during processing.

11. The method of claim 1, wherein processing is etching and the parameter is a thickness of a layer etched during processing.

12. The method of claim 1, wherein the parameter is resistivity of a layer deposited during processing.

13. The method of claim 1, wherein the parameter is sheet resistivity of a layer deposited during processing.

14. The method of claim 1, further comprising processing a process wafer in the chamber at the optimal setting to minimize non-uniformity in the process wafer.

15. The method of claim 1, wherein the model is created after processing only one test wafer for each setting adjusted.

16. A method of adjusting a semiconductor integrated circuit processing chamber for processing a substrate, comprising:
    obtaining measurements of a parameter of a first substrate processed in the chamber at a plurality of points on a linescan of the first substrate;
    adjusting a setting of the chamber;
    obtaining measurements of the parameter of a second substrate processed in the chamber at a plurality of points on a linescan of the second substrate after adjusting the setting;
    calculating a measure of non-uniformity of the parameter by weighting the measurements in accordance with a corresponding radial distance from a center of the first and second substrates;
    creating a model relating the setting adjusted to the measure of non-uniformity to minimize the measure of non-uniformity; and
    adjusting the setting to a predicted setting based on the minimized measure of non-uniformity.

17. The method of claim 16, wherein the measure of non-uniformity is minimized using iterative calculation.

18. The method of claim 17, wherein the measure of non-uniformity is minimized without processing any additional substrates.

19. The method of claim 16, wherein the measure of non-uniformity of the parameter is a standard deviation of the parameter.

20. The method of claim 16, wherein obtaining measurements of a parameter comprises calculating a polar map of the parameter from the linescan.

21. The method of claim 16, wherein calculating the measure of non-uniformity comprises calculating a weighted mean value of the parameter by weighting measurements at points in radially outer portions of the first substrate more than measurements at points at a center of the first substrate.

22. The method of claim 16, further comprising:
    adjusting additional settings and processing one additional substrate for each additional setting adjusted;
    obtaining measurements of a parameter of each additional substrate processed in the chamber at a plurality of points on a linescan of each additional substrate after adjusting each additional setting;
    calculating a measure of non-uniformity of the parameter of each of the additional substrates by weighting the measurements in accordance with a corresponding radial distance from a center of each additional substrate; and
    creating a model relating the settings adjusted to the measures of non-uniformity of each of the parameters to minimize the measures of non-uniformity.

23. The method of claim 16, further comprising processing a process wafer in the chamber at the predicted setting after adjusting the setting to the predicted setting.

24. A method of adjusting a semiconductor integrated circuit processing chamber for processing a wafer, comprising:
    processing a first wafer in the processing chamber using baseline equipment settings;
    obtaining measurements of a parameter of the first wafer at a plurality of points along a linescan on the first wafer;
    calculating a weighted mean value of the parameter by weighting the mean value by weighting radially outer portions of the first wafer more than a center of the first wafer;
    adjusting a setting of the processing chamber by a factor;
    processing a second wafer in the processing chamber after adjusting the setting;
    obtaining measurements of the parameter of the second wafer at a plurality of points along a linescan on the second wafer;
    calculating a weighted mean value of the parameter by weighting the mean value by weighting radially outer portions of the second wafer more than a center of the second wafer;
    calculating a polar map of the wafer parameter for the first wafer using the measurements obtained;
    calculating a standard deviation of the parameter within the first wafer, wherein the standard deviation is a standard deviation of the polar map;
    calculating an optimal setting by minimizing the standard deviation; and
    adjusting the setting to the optimal setting.

25. The method of claim 24, further comprising calculating an adjusted normalized value of the parameter for each of the plurality of points after calculating the polar map and before calculating the standard deviation.

26. The method of claim 24, wherein the optimal setting is calculated without processing any additional wafers.

27. The method of claim 24, wherein the linescan has 7-49 points.

28. The method of claim 24, wherein the parameter is thickness.

29. The method of claim 24, wherein the parameter is resistivity.

30. The method of claim 24, wherein the parameter is sheet resistivity.

31. The method of claim 24, wherein the setting is selected from the group consisting of main gas flow distribution settings, pressure, hydrogen flow, silicon precursor flow, germanium precursor flow, carbon precursor flow, dopant flow, dopant distribution, temperature offsets, and SCR power ratios.

32. The method of claim 24, wherein the standard deviation is minimized using a computer-based optimization tool.

33. The method of claim 24, further comprising the step of feeding the standard deviation into software for controlling the processing chamber to adjust the setting before adjusting the setting to the optimal setting.

34. The method of claim 24, further comprising processing a process wafer in the chamber after adjusting the setting to the optimal setting.

35. A method of optimizing semiconductor manufacturing equipment to minimize non-uniformity of a wafer processed in a semiconductor processing chamber, comprising:
   obtaining a plurality of measurements of a wafer parameter of a first rotated wafer processed in the chamber, wherein the plurality of measurements are taken along a linescan;
   weighting the plurality of measurements of the first rotated wafer according to a radial distance from a center of the first rotated wafer;
   adjusting at least one setting of the chamber and processing one rotated test wafer for each adjusted setting;
   obtaining a plurality of measurements of the wafer parameter of each rotated test wafer processed in the chamber for each adjusted setting, wherein the plurality of measurements are taken along a linescan;
   creating a model relating the setting to an indicator of non-uniformity of the wafer parameter by using data from the plurality of measurements and the weighted measurements;
   using the model to minimize the indicator of non-uniformity; and
   adjusting the at least one setting to an optimal setting based on the minimized indicator of non-uniformity.

36. The method of claim 35, wherein the at least one setting comprises gas flow distribution.

37. The method of claim 35, wherein the at least one setting comprises temperature control.

38. The method of claim 35, further comprising processing a process wafer in the chamber at the optimal setting.

39. A method of adjusting a semiconductor integrated circuit processing chamber for processing a wafer, comprising:
   obtaining measurements of a parameter of a baseline substrate processed in the chamber at a plurality of points on a linescan of the baseline substrate;
   adjusting at least one setting of the chamber and processing one test wafer in the chamber for each at least one setting adjusted, wherein the at least one setting comprises a gas injector setting;
   obtaining measurements of the parameter of each test wafer processed in the chamber for each at least one setting adjusted, wherein the measurements are taken along a linescan;
   weighting the plurality of measurements according to a radial distance from a center;
   creating a predictive model relating the at least one setting to a measure of non-uniformity of the parameter within the substrate by using the measurements and the weighted measurements to minimize the measure of non-uniformity; and
   adjusting the at least one setting to a predicted setting based on the minimized measure of non-uniformity.

40. The method of claim 39, wherein the at least one setting further comprises temperature control.

41. The method of claim 39, wherein the at least one setting further comprises one or more settings selected from the group consisting of pressure, hydrogen flow, silicon precursor flow, germanium precursor flow, carbon precursor flow, dopant flow, dopant distribution, temperature offsets, and SCR power ratios.

42. The method of claim 39, further comprising processing a process wafer in the chamber at the predicted setting.

* * * * *